United States Patent [19]
Allen et al.

[11] Patent Number: 5,305,399
[45] Date of Patent: * Apr. 19, 1994

[54] TWO DIMENSIONAL SHIFT-ARRAY FOR USE IN IMAGE COMPRESSION VLSI

[75] Inventors: James D. Allen, Santa Cruz; Steven M. Blonstein, San Jose, both of Calif.

[73] Assignees: Ricoh Corporation, Menlo Park, Calif.; Ricoh Company, Ltd., Tokyo, Japan

[*] Notice: The portion of the term of this patent subsequent to Jul. 7, 2009 has been disclaimed.

[21] Appl. No.: 686,485

[22] Filed: Mar. 29, 1991

Related U.S. Application Data

[63] Continuation-in-part of Ser. No. 511,245, Apr. 19, 1990, Pat. No. 5,129,015.

[51] Int. Cl.[5] .......................... G06K 9/36; G06K 9/46; G06K 9/54; G11C 8/00
[52] U.S. Cl. ....................................... 382/56; 382/49; 358/432; 365/230.04
[58] Field of Search ............... 382/56, 49, 41; 358/75, 358/432, 261.3, 133, 523, 530, 539; 364/413.19, 725; 395/250, 164; 365/78, 189.12, 230.04, 238

[56] References Cited
U.S. PATENT DOCUMENTS

| | | | |
|---|---|---|---|
| 3,629,833 | 12/1971 | Demer | 382/56 |
| 4,020,463 | 4/1977 | Himmel | 382/56 |
| 4,215,401 | 7/1980 | Holsztynski | 382/41 |
| 4,337,526 | 6/1982 | Rosler | 365/238 |
| 5,054,103 | 10/1991 | Yasuda | 382/56 |
| 5,095,374 | 4/1992 | Klein et al. | 382/56 |
| 5,129,015 | 7/1992 | Allen et al. | 382/56 |

FOREIGN PATENT DOCUMENTS

| | | | |
|---|---|---|---|
| 0021084 | 1/1981 | European Pat. Off. | G11C 11/40 |
| 1409595 | 10/1975 | United Kingdom | G11C 19/00 |
| 1422819 | 1/1976 | United Kingdom | G11C 19/00 |
| 2183374A | 6/1987 | United Kingdom | G11C 19/28 |

Primary Examiner—Leo H. Boudreau
Assistant Examiner—Michael Cammarata
Attorney, Agent, or Firm—Heller, Ehrman, White & McAuliffe

[57] ABSTRACT

A two-dimensional shift array for use in image compression VLSI techniques. The present invention utilizes a two-dimensional shift array which provides a significant savings in terms of required silicon area over a conventional implementation.

5 Claims, 5 Drawing Sheets

TWO DIMENSIONAL SHIFT-ARRAY FOR USE IN IMAGE COMPRESSION VLSI

CROSS REFERENCE TO RELATED APPLICATION

The present application is a continuation-in-part of co-pending patent application entitled APPARATUS AND METHOD FOR COMPRESSING STILL IMAGES WITHOUT MULTIPLICATION, Ser. No. 07/511,245 filed Apr. 19, 1990, now U.S. Pat. No. 5,129,015, issued Jul. 7, 1992.

BACKGROUND OF THE INVENTION

The present invention relates to a two dimensional shift-array for use in image compression VLSI.

In any high speed silicon implementation of any function where there is a continuous throughput of data such as in an image compression VLSI, it is important to keep all stages busy all of the time to maximize throughput. Often this involves the use of a "tandem" approach. Certain functions may need to be "duplicated" so that one of the two functional blocks is working on data from time and the other block is done and is passing on data from time $(t-1)$.

A desirable image compression technique is described in the above-identified cross-referenced application entitled APPARATUS AND METHOD FOR COMPRESSING STILL IMAGES WITHOUT MULTIPLICATION, the details of which are hereby incorporated by reference. In that application, such a "duplication" appears necessary at one particular stage of the process.

It would be desirable to provide an improved shift array which could be utilized in an image compression apparatus such as described in the above co-pending patent application.

SUMMARY OF THE INVENTION

It is an object of the present invention to provide a two dimensional shift array for use in image compression VLSI.

In a high speed color image compression system, it is desirable to have three sets of the shift array. The reason for this is that the color data is usually broken into three color components, such as the Y, I and Q components.

To maximize performance throughput, it is advantageous to process the three sets of values simultaneously. The savings created by going from 128 shift-array to 64 shift-array is therefore magnified. In a three-fold system, there is a savings of 192 registers. Assuming that each is 12 bit register that requires approximately 100 equivalent gates each, the saving is close to 20000 equivalent gates. This represents a sizable piece of silicon real estate.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The following is a description of a two dimensional shift-array that when implemented in silicon offers a 50% savings over a conventional implementation. The technique is discussed below taken in conjunction with the accompanying drawings.

The standard approach for a Generalized Chen Transform is to process the data in blocks of $8 \times 8$ pixels. A function of the algorithm is to break the transformation process into 16 transforms of dimension $1 \times 8$ (linear vector type). The 16 number is really two sets of 8, i.e. eight horizontal vectors are transformed, and 8 vertical vectors are transformed. The end result is a transformed 2 dimensional block.

Figure 1:
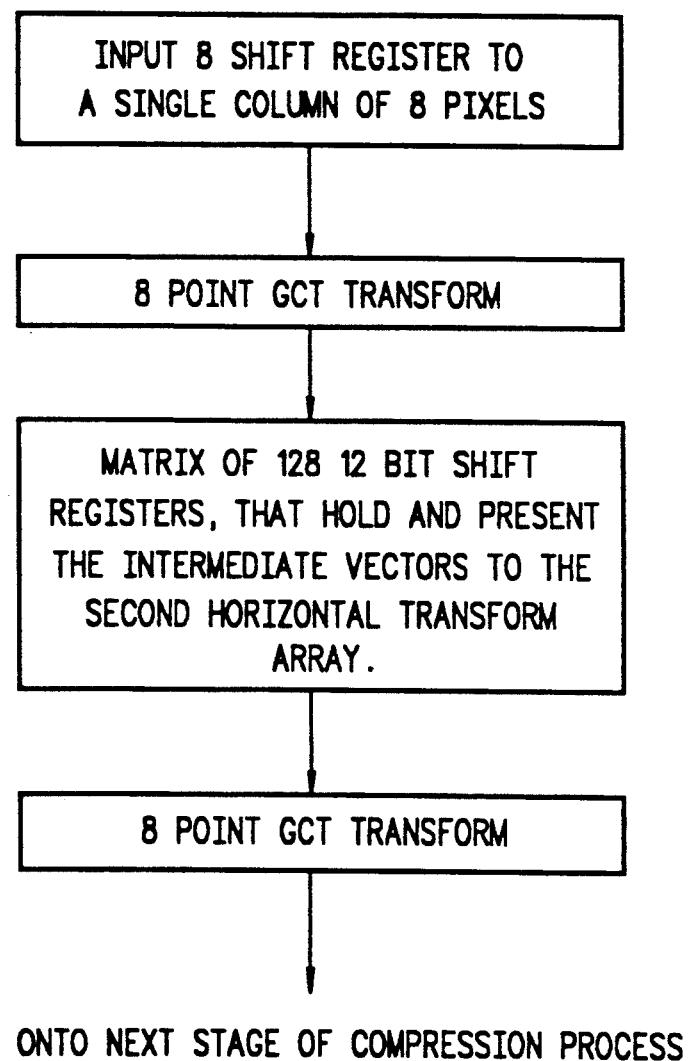
FIG. 1 depicts a tandem method for data flow.

FIG. 1 illustrates the front end of the process. There is an input shift register that holds 8 of the 64 pixels in the form of a $1 \times 8$ vector. This vector is then passed to the first transform unit. The output of the transform unit is latched into a shift-array which consists of 128 12 bit shift registers. (12 bits is an arbitrary number. It could be anywhere from say 8 to 16). Meanwhile the next $1 \times 8$ vector has been shifted in and transformed. The resultant transformed vector is shifted into the shift-array and the previous vector is shifted down one.

When the first 8 vectors have been transformed, the first half of the shift-array is full. At this point the contents of the 64 registers are shifted to 64 "neighbor" registers. From here, the intermediate values are shifted out right to left in order to have the second transform performed.

While this process is going on, the next block of pixels is filling the first half of the shift-array. This illustrates a "tandem" process in operation. However, although it is possible to keep the machine running at maximum speed, there are periods of time when certain rows of the shift-array are not utilized.

Figure 2A:
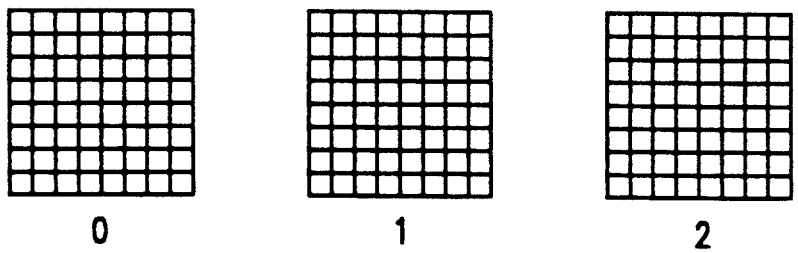
FIGS. 2A and 2B depict diagrams of pixel block numbering and pixel scan direction.
Figure 2B:
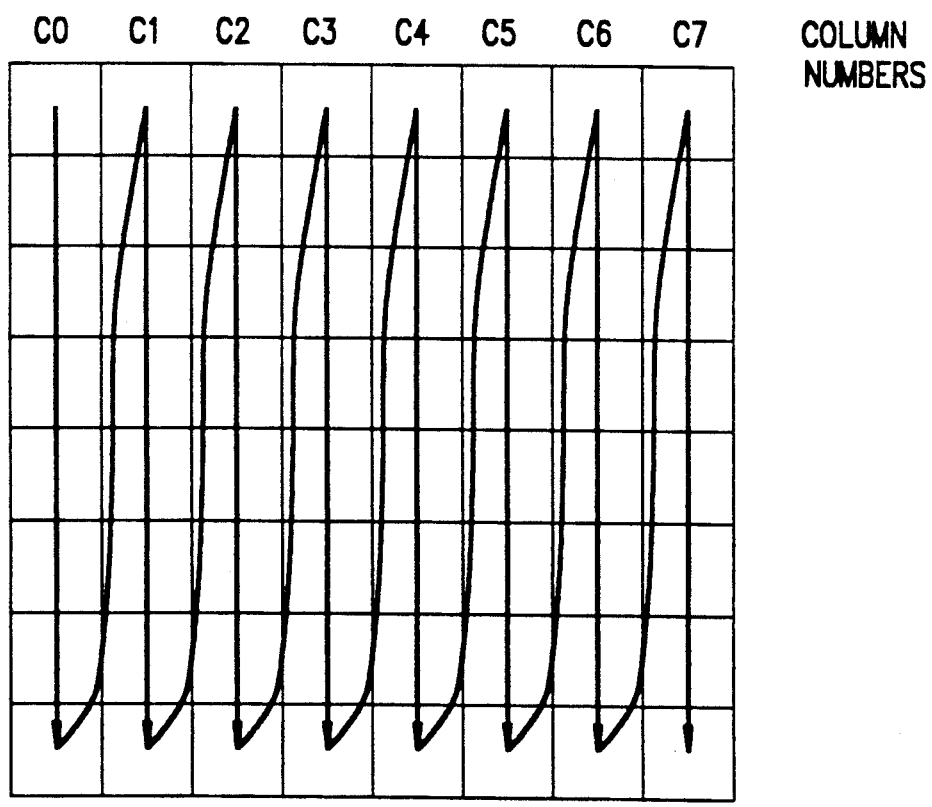
Figure 3:
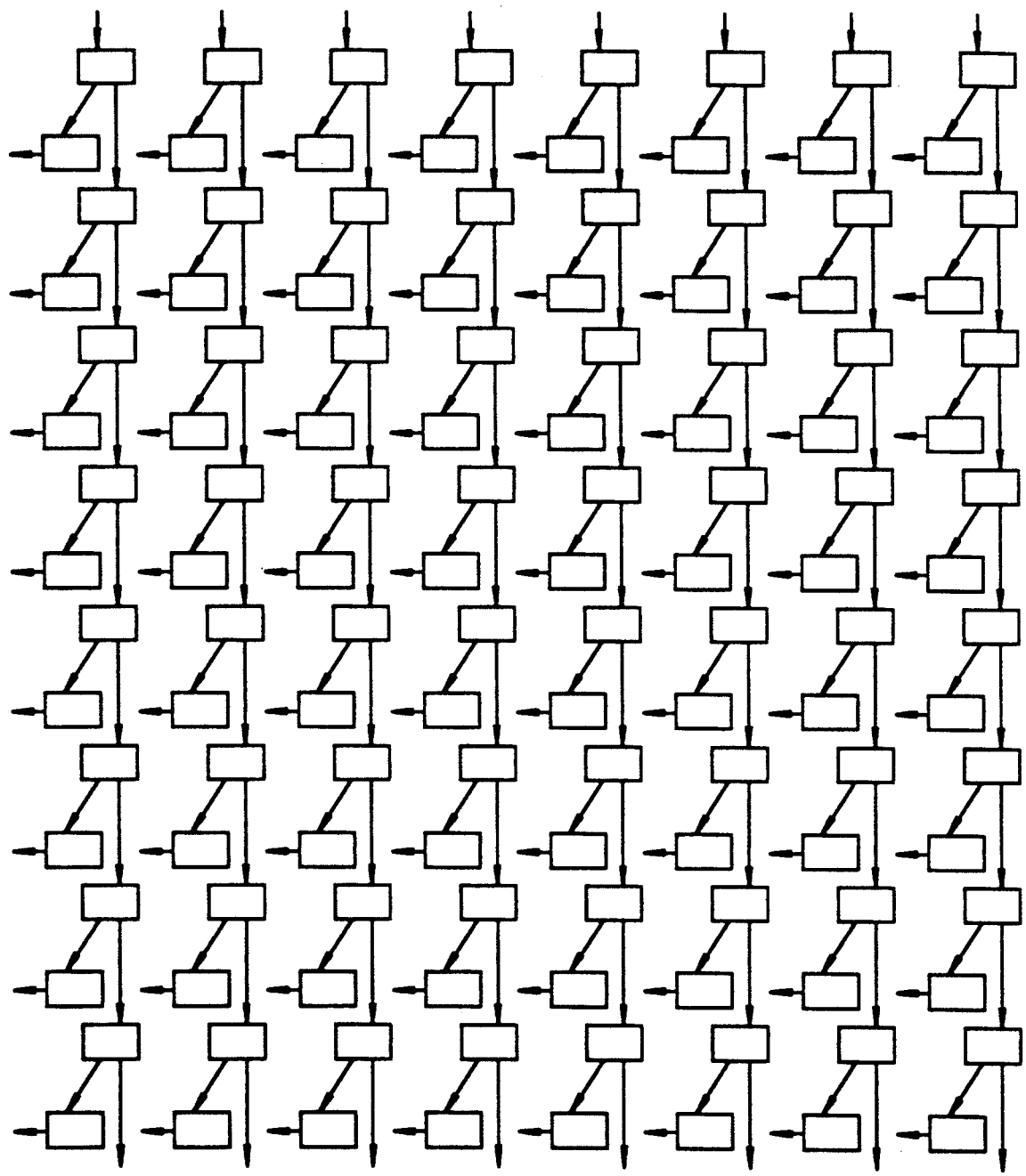
FIG. 3 depicts a block diagram of a 128 point shift array.

FIG. 2A shows the ordering of pixel blocks to be presented to the processor, FIG. 2B shows the scanning direction of pixels to be fed to the processor i.e. the order of the vectors. FIG. 3 shows the 128 point shift array. First transform coefficients appear at the top of the array and are shifted down until all eight vectors are in. Then the entire set of 8 vectors is latched diagonally and down into the neighbor set as described above.

The present invention implements exactly the same functionality with half as much silicon in the shift-array.

Figure 4:
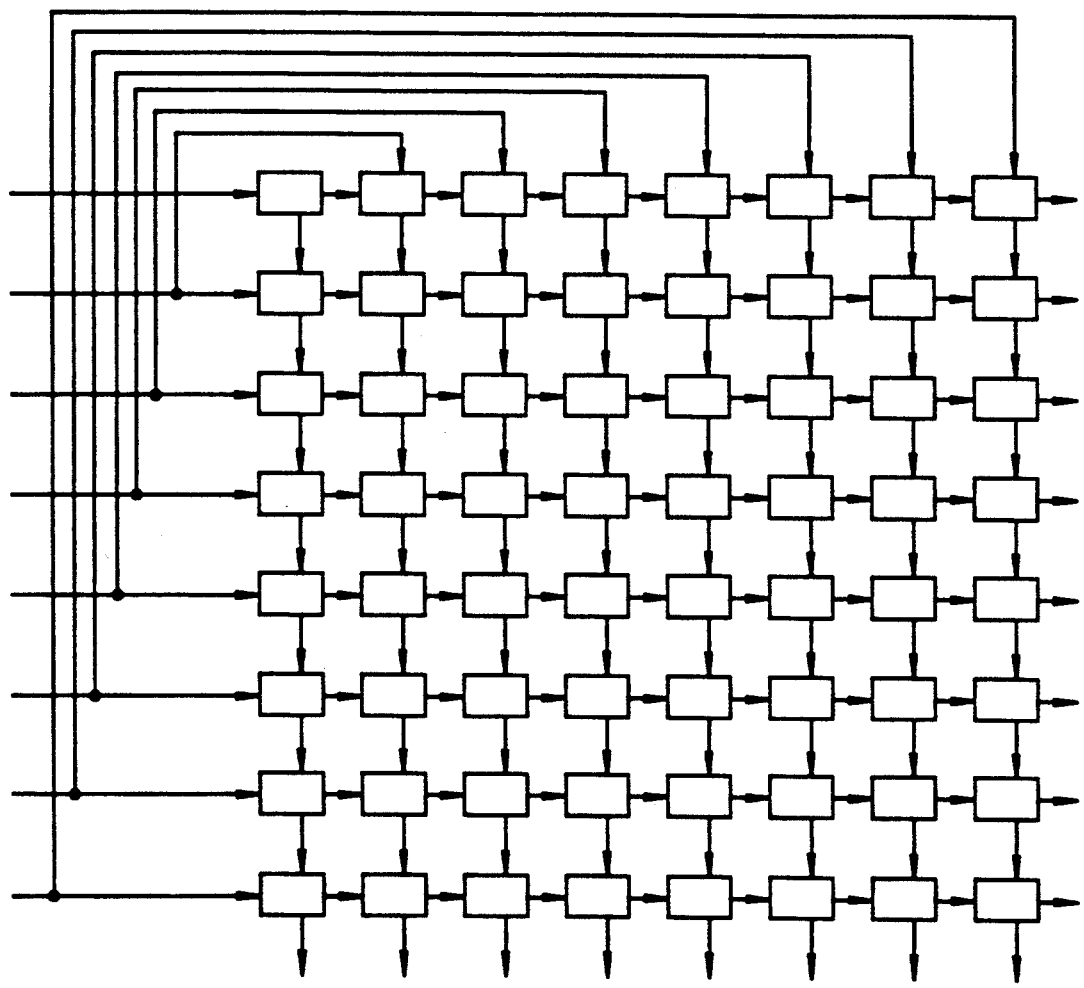
FIG. 4 depicts a reduced two-dimensional shifter according to the present invention.

Thus only 64 12 bit shift registers are required. The structure for such an array is shown in FIG. 4. It is very important to note that in the 128 element model each element of the array would receive an input from only one direction. The main registers always receive inputs form the top and shift out in a downward direction. The "neighbor" registers receive data from the left and always shift out to the right.

In the example in FIG. 4, each element can receive inputs from 2 directions and output them in 2 directions. Thus, the array can shift in 2 directions. This is a key to the present invention.

Figure 5A:
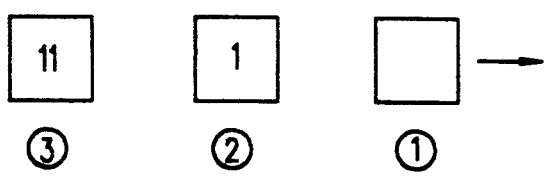
FIGS. 5A-5G depict an illustration of data flow through a two-dimensional shifter according to the present invention.

FIG. 5a shows three pixel blocks - block 1, block 2 and block 3. Block 1 is the first into the transposition mechanism, then block 2 (which is labeled '), and block 3 (which is labeled ").

Figure 5B:
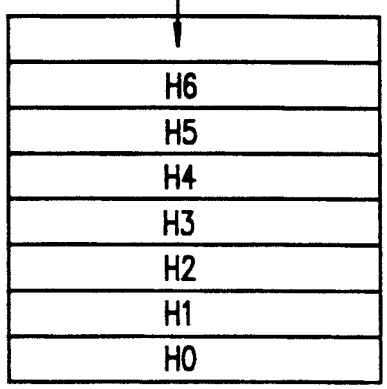
Figure 5C:
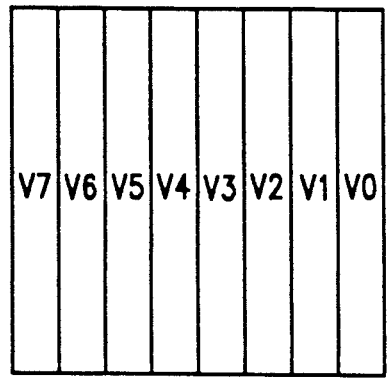
Figure 5D:
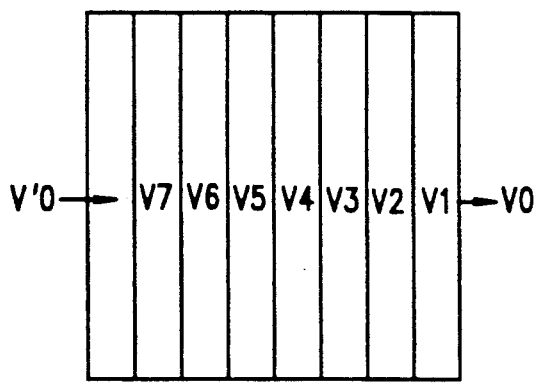
Figure 5E:
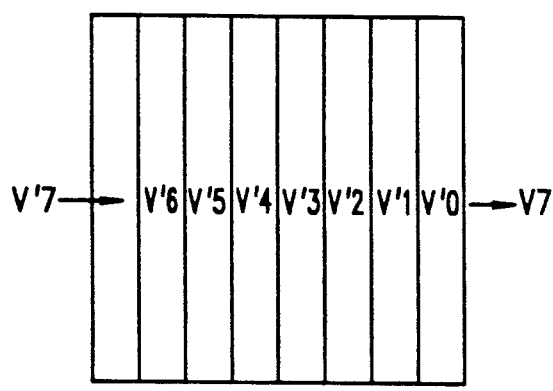
Figure 5F:
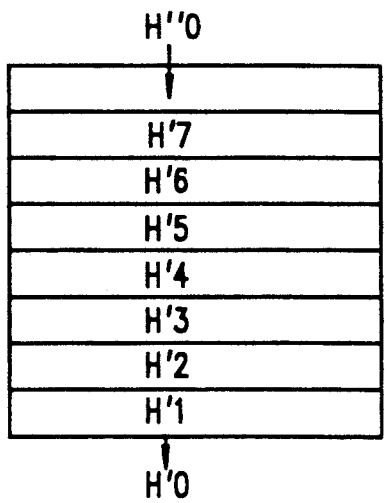
Figure 5G:
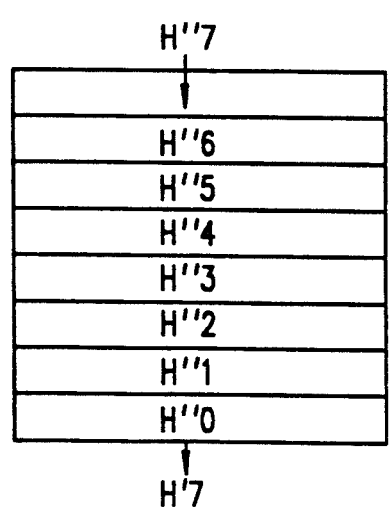

FIG. 5b shows the process of the horizontal vectors from the first block filling the array. When the array is full it is flipped through 90°, so they become vertical vectors as seen in FIG. 5c. Then the vertical vectors (starting with V0) shift out to the right (FIG. 5d). Meanwhile the vertical prime vectors from block 2 start to arrive from the left (FIGS. 5d–5e). Finally, when V7 in FIG. 5d shifts out, there is now an array that's full with the V' vectors which form the second block. At this point, the array shifts 90° again so that now those V' vectors become H' vectors (FIG. 5f). The H' vectors are shifted out from the bottom and the H" vectors start arriving from block 3 (FIGS. 5f–5g). Once the H' vectors are shifted out, the array is filled with H" vectors. Another 90° rotation brings the present invention back to the starting point.

By rotating the shift direction by 90 degrees, and shifting from left to right, it is possible to transform the intermediate vectors into the expected dimensionality for the horizontal transformer. Thus during all even numbered pixel blocks the array is shifted left to right, and on odd numbered pixel blocks, the array is shifted top to bottom. This method makes full utilization of the silicon.

The foregoing descriptions of specific embodiments of the present invention have been presented for purposes of illustration and description. They are not intended to be exhaustive or to limit the invention to the precise forms disclosed, and it should be clear that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. Two dimensional image compression apparatus for use in image compression image pixel data wherein said image pixel data is in the form of blocks of $1 \times N$ pixel vectors, said image compression apparatus comprising
   means for performing a transform on rows of said blocks of $1 \times N$ pixel vectors to generate even and odd blocks of partially transformed vectors,
   shift array means including a plurality of multi-bit shift registers
   for shifting said even and odd blocks of partially transformed vectors in at least two directions through said plurality of shift registers of said shift array means including means for shifting said odd blocks of partially transformed vectors in a first direction and means for shifting said even blocks of partially transformed vectors in a second different direction to provide rotated blocks of partially transformed vectors, and
   means for performing a transform on rows of said rotated blocks of partially transformed vectors to provide blocks of two-dimensionally transformed vectors.

2. The apparatus as in claim 1 wherein said shift array means shifts said odd and even blocks of partially transformed vectors from a first left input and a first top input of said shift array means to a first right hand output and to a first bottom output, respectively.

3. The apparatus as in claim 1 including means for shifting said odd blocks of partially transformed vectors horizontally through said shift array means and said even blocks of partially transformed vectors vertically through said shift array means.

4. An apparatus for use in image compression of a first sequence of blocks of pixel vectors, said apparatus comprising
   first transform means for performing a transform on said first sequence of blocks of pixel vectors to generate a second sequence of blocks of transform vectors comprised alternately of even and odd blocks of transform vectors,
   shift array means including a plurality of multi-bit shift registers,
   means for shifting said even blocks of transform vectors into said plurality of shift registers of said shift array means in a first direction, and said odd blocks of transform vectors into said plurality of shift registers of said shift array means in a second direction, said second direction being orthogonal to said first direction, to generate a third sequence of blocks of rotated vectors, and
   second transform means for performing a transform on said third sequence of blocks of rotated vectors to generate a fourth sequence of transformed blocks of vectors.

5. A method for matrix transposition of a first sequence of blocks of vectors in a multi-bit shift array to generate a second sequence of transposed blocks of vectors, comprising the steps of:
   shifting a first block of vectors from said first sequence into said shift array in a first direction;
   shifting a second block of vectors from said first sequence into said shift array in a second direction while shifting a first block of vectors of said second sequence out of said shift array, said second direction being orthogonal to said first direction, said first block of vectors of said second sequence representing a matrix transposition of said first block of vectors from said first sequence; and
   shifting a third block of vectors from said first sequence into said shift array in a third direction while shifting a second block of vectors of said second sequence out of said shift array, said third direction being orthogonal to said second direction, said second block of vectors of said second sequence representing a matrix transposition of said second block of vectors from said first sequence.

* * * * *